(12) United States Patent
Jorritsma et al.

(10) Patent No.: US 9,503,023 B2
(45) Date of Patent: Nov. 22, 2016

(54) CLASS-D AMPLIFIER

(71) Applicant: NXP B.V., Eindhoven (NL)

(72) Inventors: Fré Jorrit Jorritsma, Baarlo (NL);
Mattheus Johan Koerts, Arnhem (NL);
Fred Mostert, Horssen (NL)

(73) Assignee: NXP B.V., Eindhoven (NL)

( * ) Notice: Subject to any disclaimer, the term of this patent is extended or adjusted under 35 U.S.C. 154(b) by 28 days.

(21) Appl. No.: 14/676,411

(22) Filed: Apr. 1, 2015

(65) Prior Publication Data
US 2016/0294326 A1 Oct. 6, 2016

(51) Int. Cl.
| | |
|---|---|
| *H03F 3/217* | (2006.01) |
| *H03F 1/04* | (2006.01) |
| *H03F 1/02* | (2006.01) |
| *H03F 3/185* | (2006.01) |
| *H03F 3/21* | (2006.01) |

(52) U.S. Cl.
CPC ............ *H03F 1/0205* (2013.01); *H03F 3/185* (2013.01); *H03F 3/211* (2013.01); *H03F 3/217* (2013.01); *H03F 2200/03* (2013.01); *H03F 2200/129* (2013.01); *H03F 2200/351* (2013.01); *H03F 2203/21142* (2013.01)

(58) Field of Classification Search
CPC ................................. H03F 3/217; H03F 1/04
USPC .............................................. 330/251, 207 A
See application file for complete search history.

(56) References Cited

U.S. PATENT DOCUMENTS

| | | | | |
|---|---|---|---|---|
| 4,075,507 A | * | 2/1978 | Pauli ................ | G01R 19/16576 250/221 |
| 7,224,218 B1 | | 5/2007 | Jiang et al. | |
| 2002/0125942 A1 | * | 9/2002 | Dunnebacke ...... | H03K 3/02337 330/69 |
| 2002/0167354 A1 | * | 11/2002 | Stanley ................. | H03F 3/2175 330/10 |
| 2005/0200405 A1 | | 9/2005 | Shinohara et al. | |
| 2006/0006941 A1 | * | 1/2006 | Barkaro ................... | H03F 1/34 330/251 |
| 2006/0012433 A1 | * | 1/2006 | Chung .................... | H03F 1/308 330/267 |
| 2008/0252372 A1 | * | 10/2008 | Williams ............... | H01L 24/49 330/251 |
| 2008/0278984 A1 | * | 11/2008 | Stanley ................... | H02M 7/48 363/95 |
| 2013/0223652 A1 | | 8/2013 | Sahandiesfanjani et al. | |

FOREIGN PATENT DOCUMENTS

| | | |
|---|---|---|
| EP | 2375566 A1 | 8/2011 |
| GB | 2496664 A | 5/2013 |

OTHER PUBLICATIONS

Extended European Search Report for Patent Appln. No. 16162898.7 (Aug. 5, 2016).

* cited by examiner

*Primary Examiner* — Patricia T Nguyen

(57) ABSTRACT

One example discloses a class-D amplifier apparatus, comprising: an amplifier circuit, having a set of input terminals, a set of output terminals, a quiescent circuit configuration, and an active circuit configuration; an amplifier control device, coupled to the amplifier circuit; wherein the amplifier control device is configured to place the amplifier circuit in the quiescent circuit configuration before measuring a voltage between the set of output terminals; wherein the amplifier control device is configured to add the output terminals voltage from the set of input terminals before placing the amplifier circuit in the active circuit configuration.

16 Claims, 7 Drawing Sheets

CLASS-D AMPLIFIER

The present specification relates to systems, methods, apparatuses, devices, articles of manufacture and computer readable mediums for class-D amplifiers.

SUMMARY

According to an example embodiment, a class-D amplifier apparatus, comprises: an amplifier circuit, having a set of input terminals, a set of output terminals, a quiescent circuit configuration, and an active circuit configuration; an amplifier control device, coupled to the amplifier circuit; wherein the amplifier control device is configured to place the amplifier circuit in the quiescent circuit configuration before measuring a voltage between the set of output terminals; wherein the amplifier control device is configured to add the output terminals voltage from the set of input terminals before placing the amplifier circuit in the active circuit configuration.

In another example embodiment, the amplifier circuit further comprising a class-D amplifier; and in the quiescent circuit configuration, the class-D amplifier is not configured to switch.

In another example embodiment, the amplifier circuit further comprising a class-D amplifier; and in the active circuit configuration, the class-D amplifier is configured to switch.

In another example embodiment, the amplifier circuit further comprising a digital control loop coupled to the output terminals and the input terminals of the amplifier circuit; the output terminals are configured to transmit analog output signals; the input terminals are configured to receive analog input signals; the digital control loop is configured to digitize the measured voltage difference between the output terminals and output an input offset signal on at least one of the input terminals; and the input offset signal is equivalent to the measured voltage difference.

In another example embodiment, the digital control loop includes a common mode part and a differential mode part.

In another example embodiment, the digital control loop includes an analog to digital converter (ADC) configured to digitize the measured voltage difference between the output terminals.

In another example embodiment, the digital control loop includes an adder and a low-pass filter and sample and hold (LPF/S&H) circuit coupled to the ADC and configured to remove an ADC internal offset error.

In another example embodiment, the digital control loop includes a low-pass filter and sample and hold (LPF/S&H) circuit configured to output the input offset signal on at least one of the input terminals.

In another example embodiment, the input offset signal is an input set-point for the class-D amplifier.

In another example embodiment, the amplifier control is configured to ramp the input offset signal from the measured voltage difference to a lower voltage difference while in the active circuit configuration.

In another example embodiment, in the quiescent circuit configuration, the amplifier control device charges the set of output terminals to a predetermined voltage level.

In another example embodiment, the amplifier control device charges the set of output terminals to less than 50% of a supply voltage for the amplifier apparatus.

In another example embodiment, the amplifier control device is configured to discharge voltage levels on the output terminals during calibration of the amplifier apparatus.

In another example embodiment, the output terminals are discharged with a programmable current-DAC.

In another example embodiment, the amplifier circuit further comprising a reconstruction filter coupled to provide the voltage to the output terminals.

Another example embodiment includes an article of manufacture including at least one non-transitory, tangible machine readable storage medium containing executable machine instructions for controlling a class-D amplifier, the instructions comprising: wherein the article includes, an amplifier circuit, having a set of input terminals, a set of output terminals, a quiescent circuit configuration, and an active circuit configuration; and an amplifier control device, coupled to the amplifier circuit; and wherein the instructions include: configuring the amplifier control device to place the amplifier circuit in the quiescent circuit configuration before measuring a voltage between the set of output terminals; and configuring the amplifier control device to add the output terminals voltage from the set of input terminals before placing the amplifier circuit in the active circuit configuration.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings, in which:

Figure 1:
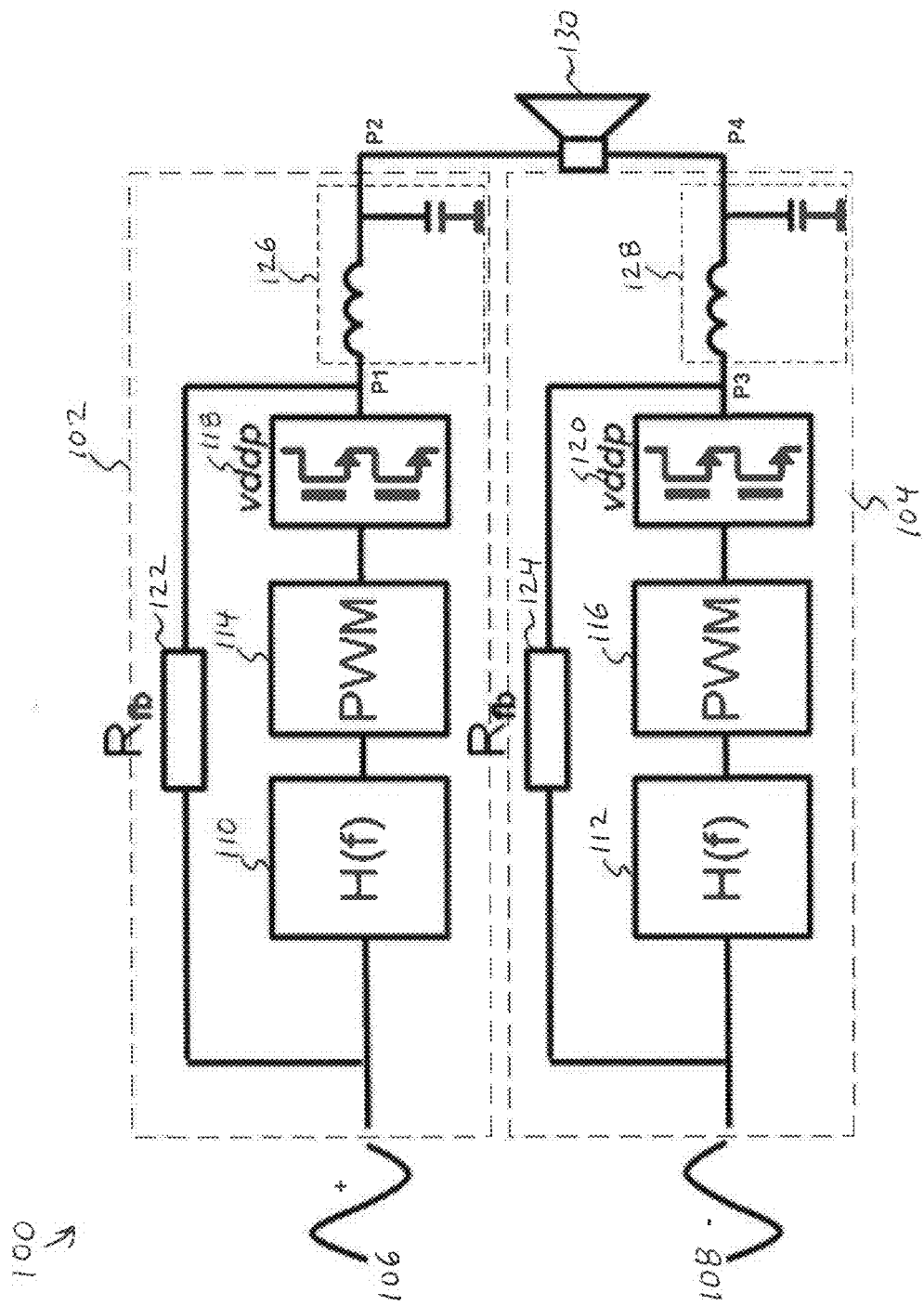
FIG. 1 is a class-D amplifier circuit.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

FIG. 1 is an example class-D amplifier circuit 100. The class-D amplifier circuit 100 includes: a first amplification path 102 receiving a first input signal 106 (e.g. [+]); a second amplification path 104 receiving a second input signal 108 (e.g. [-]).

Each path 102, 104 includes: a loop filter (H(f)) 110, 112; a PWM modulator 114, 116; a switching amplifier 118, 120; a feedback path 122, 124; and a reconstruction filter 126, 128. Defined points in the circuit 100 include: output stage digital signals P1, P3; and reconstructed analog signals P2, P4 electrically connected to a speaker 130.

The PWM modulator signal which is generated when the power stage is enabled in one example has a constant modulation depth of 50% for both the plus and the minus output terminals. (i.e. a class-D amplifier optimally switches at 50% of its normal duty cycle). The first cycle of the PWM modulator signals in one example has a pulse width of 25%.

Figure 2:
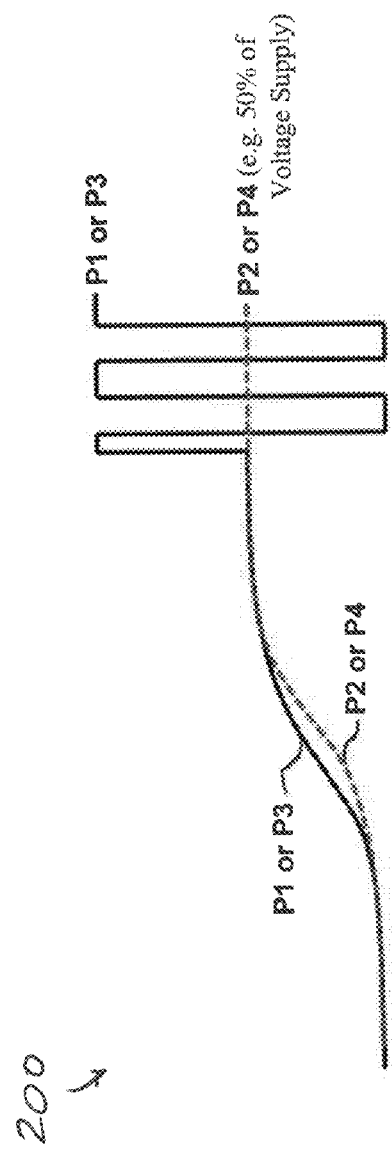
FIG. 2 is a first example signal diagram.

A class-D amplifier can be started in a feed forward method, wherein before the output stages of the amplifier are enabled, the outputs are slowly charged to 50% of the supply voltage, as shown in FIG. 2, which is a first example signal diagram 200, showing a set of output stage digital signals P1 or P3 and a set of reconstructed analog signals P2 or P4. Even if the amplifier 100 is muted (i.e. no audio input signal is amplified) the amplifier 100 will still make an audible pop noise on the speaker 130 upon power-up. Example measured peak pop noises using current class-D amplifiers is 15 mV or higher.

Due to small timing mismatches between the loop filters 110, 112 and PWM modulators 114, 116 both of the PWM modulator 114, 116 output signals will show some differences which are then input to the switching amplifiers 118, 120. An example of these timing mismatch differences are shown in FIG. 3.

Figure 3:
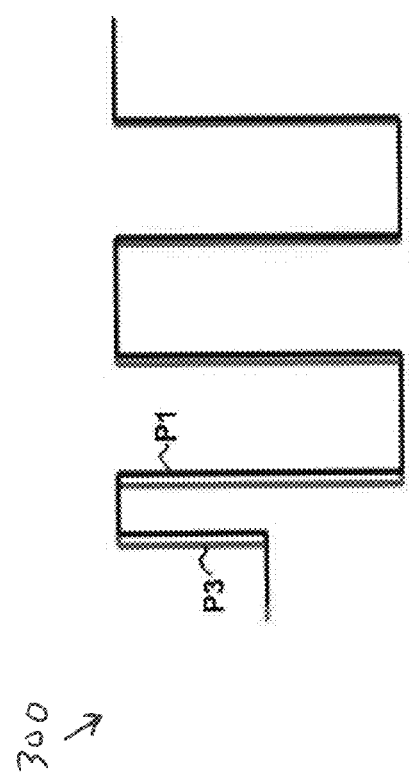
FIG. 3 is a second example signal diagram.

FIG. 3 is a second example signal diagram 300 showing an example set of PWM modulator 114, 116 output signals (or alternatively a set of output stage digital signals P1 or P3) from the first and second amplification paths 102, 104 having timing mismatch.

Audible pop noises are also possible due to: a mismatch between the initial charging voltage and the average level of the PWM modulator signal, resulting in a common mode step; the charging of the output capacitors before the power stages are enabled might show some mismatch, resulting in a differential mode step; component spread of the inductors and capacitors of the reconstruction filter; and mismatch in Rdson of the output stage transistors.

Since the transfer function of the power stages are not linear, the feedback path is used to partly compensate. However loop gain in the amplifier circuit 100 of FIG. 1 is limited to keep the overall analog control loop stable. Loop gain is especially limited for frequencies above 1kHz, however the audible frequency spectrum reaches 20 kHz. Thus the analog control loop's ability to compensate for non-linearity of the power state transfer functions is limited.

Another technique for compensating for the non-linearity of the power state transfer functions is to include the reconstruction filters 126, 128 in the overall control loop. Such amplifiers are called "feedback after filter" amplifiers. This gives only very limited compensation improvement due to the limitation of this system with respect to stability and still result in audible pop noises.

In FIGS. 4-8 an apparatus and method for starting-up a class-D amplifier without causing any audible pop noise is discussed. This apparatus first measures a voltage across an amplifier's output terminals which are connected to an output device. Then the apparatus matches the amplifier's output state to the measured voltage before powering-up the amplifier.

In one example embodiment a digital control loop within the amplifier apparatus enables a higher loop gain than an analog control loop. With this higher loop gain, non-linearity within the loop can be more effectively compensated.

A reconstruction filter included within the control loop enables the amplifier apparatus to measure the voltage of both amplifier output terminals just before enabling the amplifier's power stages. Using this measured voltage as a set-point for the control loop, the voltage at the output terminals will result in almost no voltage step within an audible frequency range (i.e. up to 20 kHz), resulting in a pop-noise free amplifier start-up. Pop noise level can be below 1 mV, which is inaudible, and the amplifier's initial PWM modulation depth need not be 50%. The apparatus also permits faster amplifier start-up due to limited charging of the power stage outputs. The apparatus is also less sensitive to internal component variations and external sources of output offset, such as leakage.

In various embodiments, this apparatus can be included in various Class-D amplifiers or a PWM modulator generating module, such as a PWM modulator based DAC.

Figure 4:
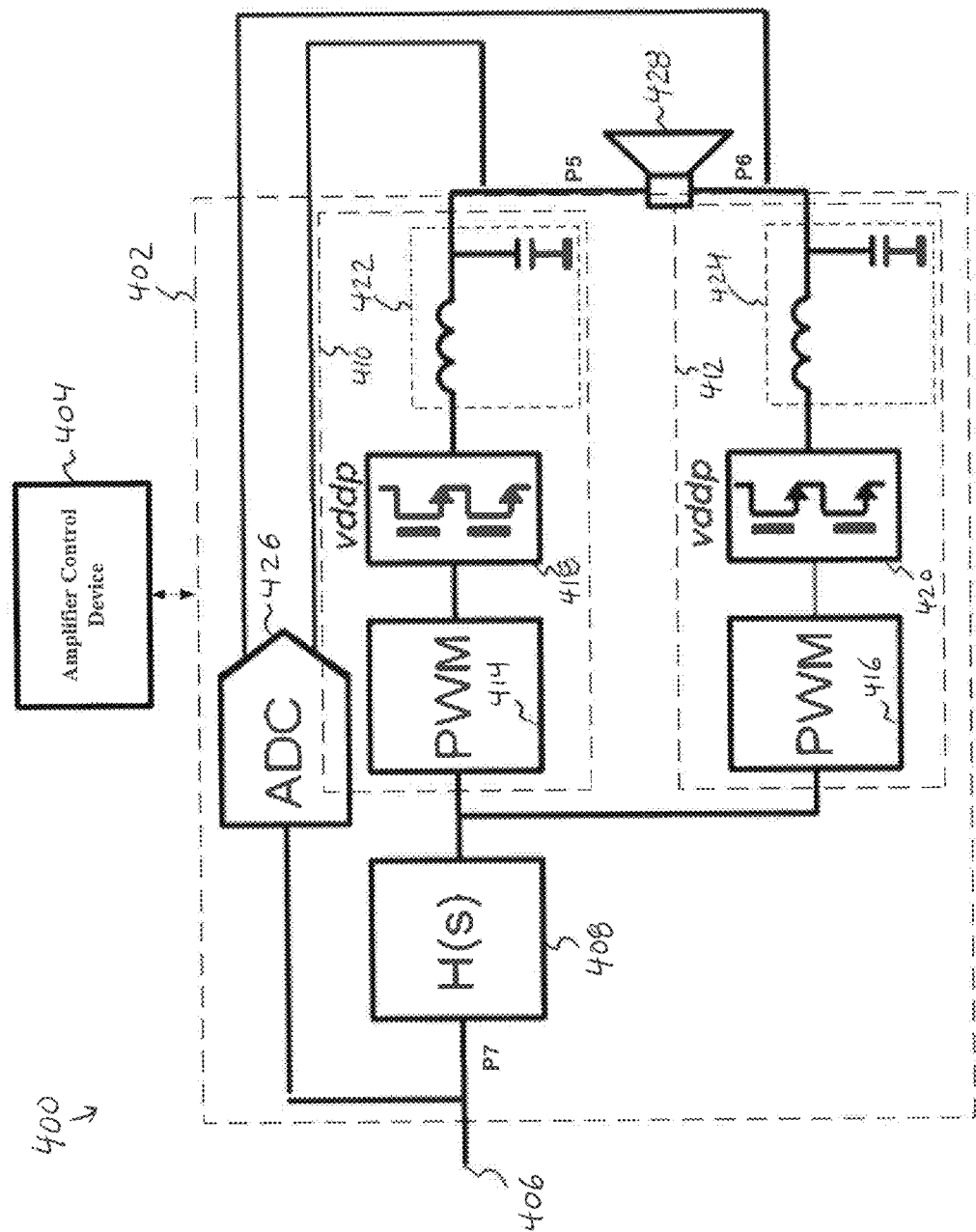
FIG. 4 is a first example class-D amplifier apparatus.

FIG. 4 is a first example class-D amplifier apparatus 400 having a digital control loop. The amplifier apparatus 400 includes a class-D amplifier circuit 402 having a set of input terminals 406 for receiving an input signal, and an amplifier control device 404. The class-D amplifier circuit 402 includes: a loop filter (H(s)) 408; a first amplification path 410; and a second amplification path 412. Each amplification path 410, 412 includes: a PWM modulator 414, 416; a switching amplifier 418, 420; and a reconstruction filter 422, 424. The class-D amplifier circuit 402 also includes an ADC 426. The output device 428 (e.g. speaker, or some other device), in one example embodiment, is NOT a part of the amplifier circuit 402. Defined points in the class-D amplifier circuit 402 include: analog output terminals P5 or P6 electrically connected to the output device 428; and a digital control loop input P7.

After power-on of the apparatus 400, the amplifier control device 404 commands the amplifier circuit 402 to charge both analog output terminals P5 and P6 to a predetermined voltage level, such as 10% of the supply voltage for the apparatus 400.

The ADC 426 then digitizes the measured voltages at analog output terminals P5 and P6. The digitized signal from the ADC 426 (i.e. an input offset signal) then feeds back to the digital control loop input P7 of the loop filter (H(s)) 408. As a result, any voltage mismatch at the analog output terminals P5 and P6 is canceled. The ADC 426 and loop filter 408 together form a digital control loop for the class-D amplifier 400.

Thus, when the amplifier control device 404 changes the class-D amplifier 400 from a quiescent circuit configuration (e.g. input signal muted or the class-D amplifier is not configured to switch) to an active circuit configuration (e.g. input signal amplified or the class-D amplifier is configured to switch), by powering up the switching amplifiers 418, 420, there will not be an audible pop-noise on the output device 428. Any error due to mismatches in the power stages or reconstruction filters will be compensated by the high loop gain of the digital control loop.

If there is an offset voltage across the output terminals just before enabling the power stages, this offset will be held by the digital control loop. This results in minimal to no discontinuities in the output signals which would cause a pop noise.

Note that FIG. 4 shows a simplified representations of the class-D amplifier apparatus 400. In a production version of the apparatus 400 there is a digital control loop for a common mode part and a separate digital control loop for a differential mode part. Both have a set-point (i.e. input offset signal) which are initially set.

Figure 5:
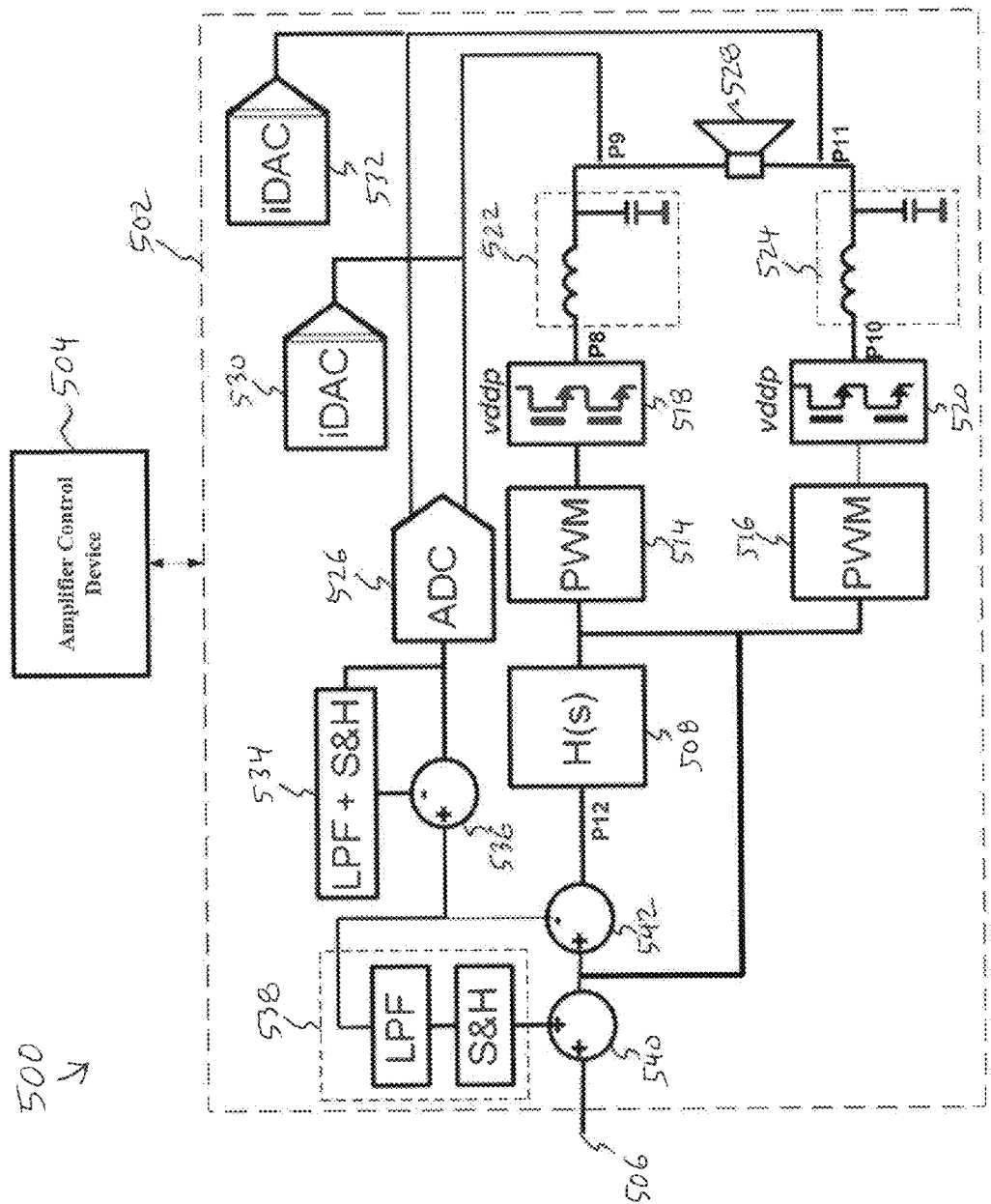
FIG. 5 is a second example class-D amplifier apparatus.

FIG. 5 is a second example class-D amplifier apparatus 500 having a digital control loop. The amplifier apparatus 500 includes a class-D amplifier circuit 502, having a set of input terminals 506 for receiving an input signal, and an amplifier control device 504. The class-D amplifier circuit 502 includes: a loop filter (H(s)) 508; PWM modulator 514, 516; switching amplifier 518, 520; digital terminals P8 or P10; reconstruction filter 522, 524; analog output terminals P9 or P11; an ADC 526; a first iDAC 530 (e.g. current(i) DAC); a second iDAC 532 (e.g. current(i) DAC); LPF/S&H 534 (i.e. low-pass filter and sample and hold); a first adder 536; LPF/S&H 538; a digital control loop input P12 for receiving an input offset signal; a second adder 540; and a third adder 542. In one example embodiment, the output device 528 (e.g. speaker) is NOT a part of the amplifier apparatus 500.

After power-on of the apparatus 500, a calibration routine is initiated. First, since voltage levels on the output terminals P8 and P10 are unknown at start-up, these voltages are discharged using a programmable iDAC 530 (e.g. current(i) DAC) connected to P8 and a programmable iDAC 532 connected to P10. Second, the ADC 526 output in the digital control loop feedback path is calibrated to remove any ADC internal offset errors. This is done using LPF/S&H 534 (i.e. low-pass filter and sample and hold). An ADC offset error correction is then added to the ADC 526 output using a first adder 536. After this calibration, the digital output of the ADC 526 will accurately digitize the voltages at analog output terminals P8 or P10.

Next the amplifier control device 504 commands the iDACs 530, 532 to charge both analog output terminals P8 and P10 to a predetermined voltage level, such as 10% of the supply voltage for the apparatus 500.

The ADC 526 then digitizes the measured voltages at analog output terminals P8 or P10. The digitized signal from the ADC 526 then feeds back to the LPF/S&H 538 (i.e. low-pass filter and sample and hold). The output from the LPF/S&H 538 is an input offset signal which is sent through the second and third adders 540, 542 to the digital control loop input P11 of the loop filter (H(s)) 508. As a result, any voltage mismatch at the analog output terminals P8 or P10 is canceled. The ADC 526 and loop filter 508 together form a digital control loop for the class-D amplifier 500.

Figure 6:
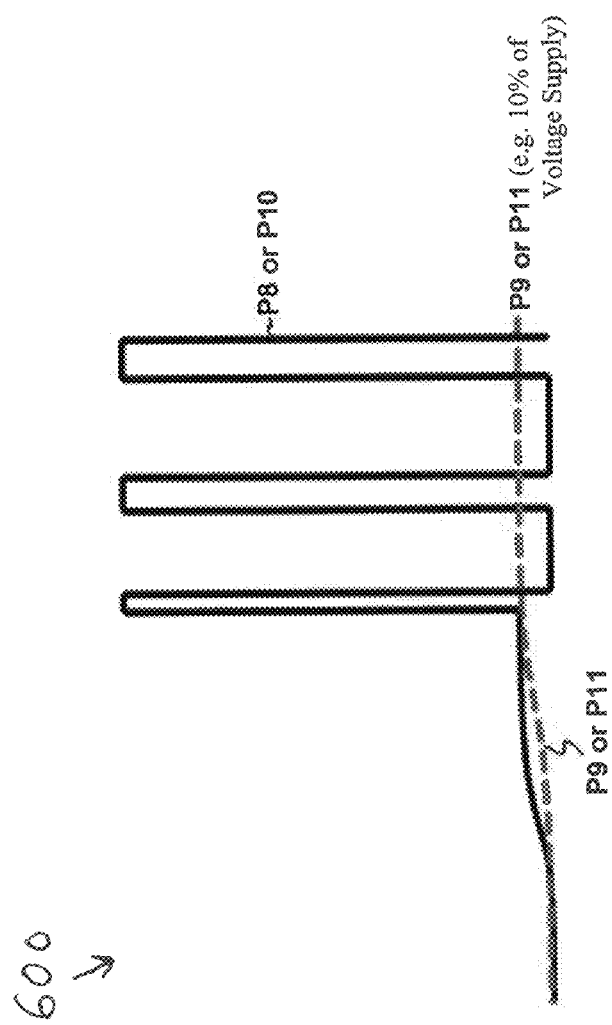
FIG. 6 is a third example signal diagram.

FIG. 6 is a third example signal diagram 600, which shows an example set of digital signals on terminals P8 or P10 and analog signals on output terminals P9 or P11 during start-up of the class-D amplifier apparatus 500.

Thus, when the amplifier control device 504 changes the class-D amplifier 500 from a quiescent circuit configuration to an active circuit configuration, by powering up the switching amplifiers 518, 520, there will not be an audible pop-noise on the output device 528. Any error due to mismatches in the power stages or reconstruction filters will be compensated by the high loop gain of the digital control loop.

During operation, when the amplifier 500 is in an active state, the amplifier control device 504 in an example embodiment slowly removes (e.g. ramps lower) the input offset signal added to the digital control loop input P12 (receives) by lowering the input offset signal to 0% using a ramp function. The amplifier control device 504 can also ramp up the common mode component to 50% of the supply voltage using a ramp function.

Note that FIG. 5 shows simplified representations of the class-D amplifier apparatus 500. In a production version of the apparatus 500 there is a digital control loop for the common mode part and a separate digital control loop for the differential mode part. Both have a set-point (i.e. input offset signal) which are initially set by the sample and hold. After enabling the amplifier both the differential mode and the common mode part can be slowly changed to the desired value. This can be done with a ramp function, meaning a constant slew rate. This constant slew rate can be programmed into the amplifier control device 504, to enable to find the fastest time to remove the input offset signal without causing any pop noise.

A specific example of this ramping process is now discussed. After enabling (i.e. powering-on) the amplifier, both analog output terminals P9 or P11 have the same voltage as they had before the amplifier was started, for example 2.0V and 2.1V. After calibration and offset compensation, the analog output terminals P9 or P11 will have a minimum offset, meaning the average output level of both the plus and minus should be almost equal. This is called the differential component (2.1-2.0=0.1 V).

The common mode part of the outputs, meaning the average voltage of both outputs ((2.0+2.1)/2=2.05V), are then increased to half the supply voltage of the output stage 518 or 520 (i.e. vddp). If the supply voltage is 14.4V, the outputs are increased to an average level of 7.2V. Thus, the differential mode set-point will be slowly ramped down from 0.1V to 0V, and the common mode set-point will slowly be ramped up from 2.05 to 7.2V. These two items can be done at the same time or independent.

Figure 7:
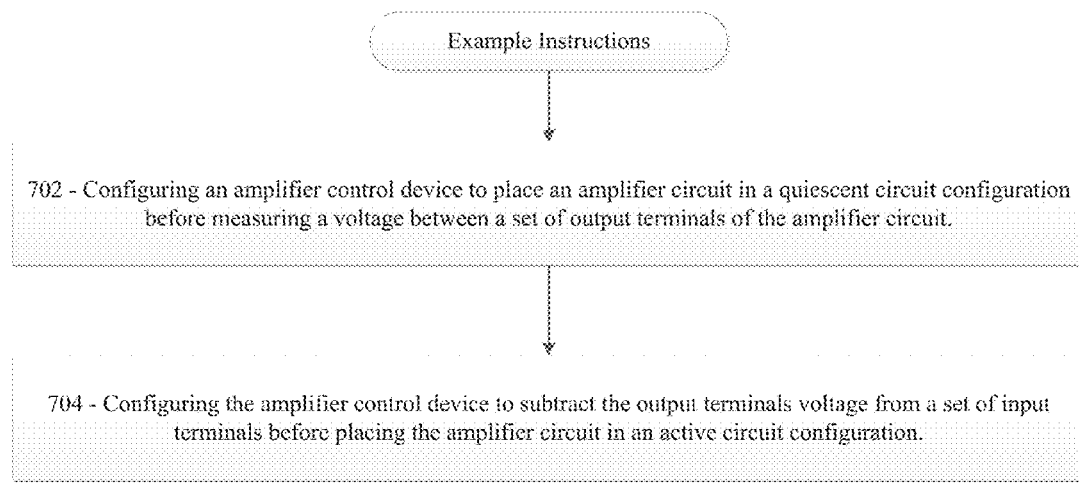
FIG. 7 is an example list of instructions for enabling the second example class-D amplifier circuit.

FIG. 7 is an example list of instructions for enabling the second example class-D amplifier circuit. The order in which the instructions are discussed does not limit the order in which other example embodiments implement the instructions unless otherwise specifically stated. Additionally, in some embodiments the instructions are implemented concurrently.

A first example instruction set begins in 702, by configuring an amplifier control device to place an amplifier circuit in a quiescent circuit configuration before measuring a voltage between a set of output terminals of the amplifier circuit. Next, in 704, configuring the amplifier control device to add the output terminals voltage from a set of input terminals before placing the amplifier circuit in an active circuit configuration.

Figure 8:
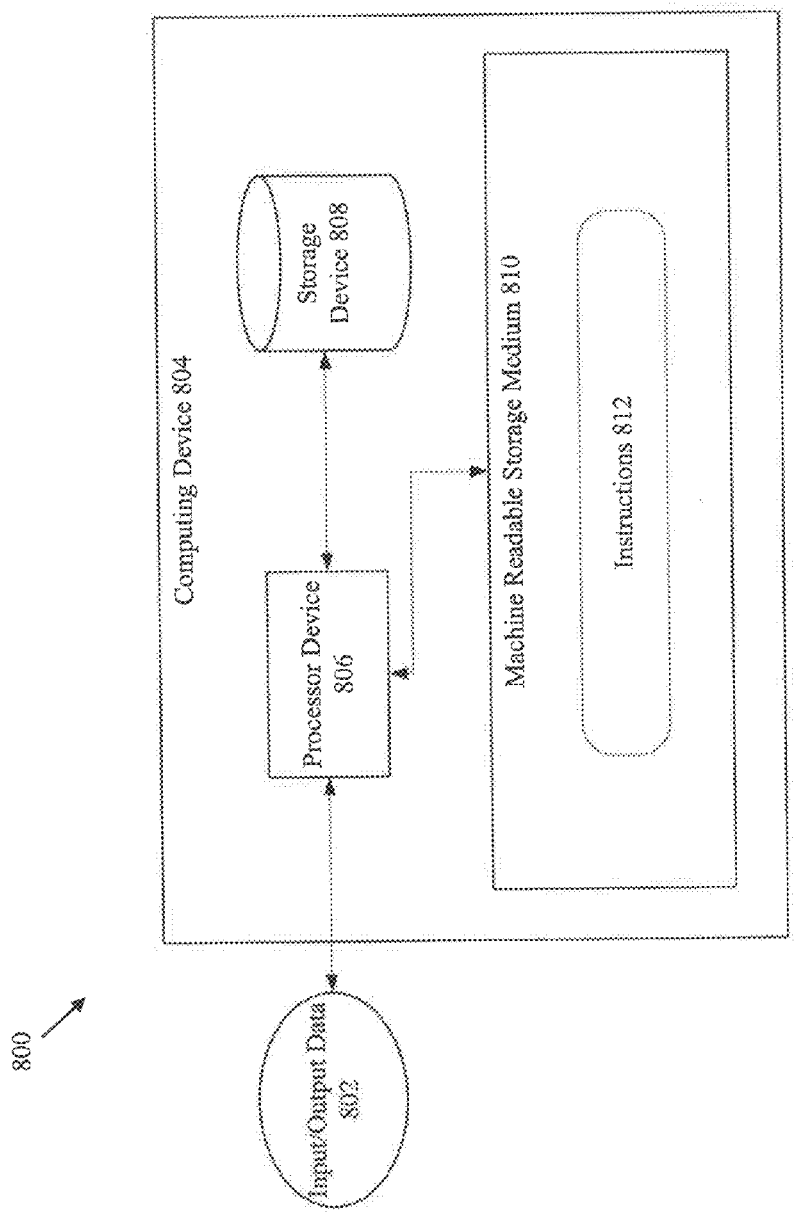
FIG. 8 is an example system for hosting instructions for enabling the second example class-D amplifier circuit.

FIG. 8 is an example system 800 for hosting instructions for enabling the second example class-D amplifier circuit. The system 800 shows an input/output data 802 interface with an electronic apparatus 804. The electronic apparatus 804 includes a processor 806, a storage device 808, and a non-transient machine-readable storage medium 810. The machine-readable storage medium 810 includes instructions 812 which control how the processor 806 receives input data 802 and transforms the input data into output data 802, using data within the storage device 808. Example instructions 812 stored in the machine-readable storage medium 810 are discussed elsewhere in this specification. The machine-readable storage medium in an alternate example embodiment is a non-transient computer-readable storage medium.

The instructions and/or flowchart steps in the above Figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. A class-D amplifier apparatus, comprising:
   an amplifier circuit, having a set of input terminals, a set of output terminals, a quiescent circuit configuration, and an active circuit configuration;
   an amplifier control device, coupled to the amplifier circuit;
   wherein the amplifier control device is configured to place the amplifier circuit in the quiescent circuit configuration before measuring a voltage between the set of output terminals;
   wherein the amplifier control device is configured to add the output terminals voltage from the set of input terminals before placing the amplifier circuit in the active circuit configuration.

2. The apparatus of claim 1:
   the amplifier circuit further comprising a class-D amplifier; and
   wherein in the quiescent circuit configuration, the class-D amplifier is not configured to switch.

3. The apparatus of claim 1:
   the amplifier circuit further comprising a class-D amplifier; and
   wherein in the active circuit configuration, the class-D amplifier is configured to switch.

4. The apparatus of claim 1:
   the amplifier circuit further comprising a digital control loop coupled to the output terminals and the input terminals of the amplifier circuit;
   wherein the output terminals are configured to transmit analog output signals;
   wherein the input terminals are configured to receive analog input signals;
   wherein the digital control loop is configured to digitize the measured voltage difference between the output terminals and output an input offset signal on at least one of the input terminals;
   wherein the input offset signal is equivalent to the measured voltage difference.

5. The apparatus of claim 4:
   wherein the digital control loop includes a common mode part and a differential mode part.

6. The apparatus of claim 4:
   wherein the digital control loop includes an analog to digital converter (ADC) configured to digitize the measured voltage difference between the output terminals.

7. The apparatus of claim 6:
   wherein the digital control loop includes an adder and a low-pass filter and sample and hold (LPF/S&H) circuit coupled to the ADC and configured to remove an ADC internal offset error.

8. The apparatus of claim 4:
   wherein the digital control loop includes a low-pass filter and sample and hold (LPF/S&H) circuit configured to output the input offset signal on at least one of the input terminals.

9. The apparatus of claim 4:
   wherein the input offset signal is an input set-point for the class-D amplifier.

10. The apparatus of claim 4, wherein the amplifier control is configured to ramp the input offset signal from the measured voltage difference to a lower voltage difference while in the active circuit configuration.

11. The apparatus of claim 1, wherein, in the quiescent circuit configuration, the amplifier control device charges the set of output terminals to a predetermined voltage level.

12. The apparatus of claim 11, wherein the amplifier control device charges the set of output terminals to less than 50% of a supply voltage for the amplifier apparatus.

13. The apparatus of claim 1, wherein the amplifier control device is configured to discharge voltage levels on the output terminals during calibration of the amplifier apparatus.

14. The apparatus of claim 13, wherein the output terminals are discharged with a programmable current-DAC.

15. The apparatus of claim 1:
   the amplifier circuit further comprising a reconstruction filter coupled to provide the voltage to the output terminals.

16. An article of manufacture including at least one non-transitory, tangible machine readable storage medium containing executable machine instructions for controlling a class-D amplifier, the instructions comprising:
   wherein the article includes,
      an amplifier circuit, having a set of input terminals, a set of output terminals, a quiescent circuit configuration, and an active circuit configuration; and
      an amplifier control device, coupled to the amplifier circuit; and
   wherein the instructions include:
      configuring the amplifier control device to place the amplifier circuit in the quiescent circuit configuration before measuring a voltage between the set of output terminals; and
      configuring the amplifier control device to add the output terminals voltage from the set of input terminals before placing the amplifier circuit in the active circuit configuration.

* * * * *